United States Patent [19]

Fletcher et al.

[11] 4,084,132
[45] Apr. 11, 1978

[54] SWEPT GROUP DELAY MEASUREMENT

[76] Inventors: James C. Fletcher, Administrator of the National Aeronautics and Space Administration, with respect to an invention of; David L. Trowbridge, Sunland, Calif.

[21] Appl. No.: 744,477

[22] Filed: Nov. 24, 1976

[51] Int. Cl.² .......................................... G01R 27/00
[52] U.S. Cl. ........................... 324/57 DE; 324/57 SS; 324/58 A
[58] Field of Search ............ 324/57 DE, 57 SS, 58 A, 324/58.5 A, 57 R

[56] References Cited

U.S. PATENT DOCUMENTS

| | | | |
|---|---|---|---|
| 2,970,258 | 1/1961 | Sinclair | 324/57 DE |
| 3,430,139 | 2/1969 | Schluter | 324/58.5 A |
| 3,437,921 | 4/1969 | Custer, Jr. | 324/58 A |
| 3,913,011 | 10/1975 | Hughes et al. | 324/57 R |

OTHER PUBLICATIONS

Couder, Measuring Group Delay, IBM Technical Disclosure Bulletin, Aug. 1971, p. 894.

*Primary Examiner*—Stanley T. Krawczewicz
*Attorney, Agent, or Firm*—Monte F. Mott; John R. Manning; Paul F. McCaul

[57] ABSTRACT

A method and apparatus for recording directly group delay measurement of a system under temperature and stress tests employing a modulated carrier frequency swept over an S or X-band of interest and applied through a reference path and a test path to separate detectors for group delay measurement using a power divider, e.g., a directional coupler or a hybrid-T junction. A phase comparator is initially balanced, and then the modulated carrier is swept in frequency over the band of interest for different conditions of temperature and/or mechanical stress to obtain a family of characteristic group-delay curves for the system under test.

11 Claims, 3 Drawing Figures

SWEPT GROUP DELAY MEASUREMENT

ORIGIN OF THE INVENTION

The invention described herein was made in the performance of work under a NASA contract and is subject to the provisions of Section 305 of the National Aeronautics and Space Act of 1958, Public Law 85-568 (72Stat. 435; U.S.C. 2457).

BACKGROUND OF THE INVENTION

This invention relates to swept group delay measurements, and more particularly to a method and apparatus for frequency sweeping a system, which may be a microwave component, and recording group delay directly as a function of frequency.

Group delay measurements are of increasing importance for high resolution ranging systems at S- and X-band. Group delay is defined as the time required for an information signal to pass through a system and can be measured as the phase shift, $\Delta\phi$, of the information signal through the system for a given input frequency, $\omega$. This suggests shifting the input frequency a predetermined amount, $\Delta\omega$, recording the resulting change of phase, and repeating the process over the desired range of frequencies. Alternatively, the input signal may be amplitude modulated by a lower modulating frequency, $f_m$. After the carrier passes through the system, the amplitude modulation is detected and compared with the phase of the modulating frequency to determine the group delay, $t_d$, of the carrier as simply $$t_d = \frac{\phi}{360° \, (fm)}$$

By using a modulation frequency of 2.7778 MHz, which is small compared to the test band widths, a direct conversion from degrees of phase to nano-seconds can be made as illustrated in the following example of a phase measurement $\phi$ of 1° with modulation of 2.7778 MHz;

$$t_d = \frac{1°}{(2.7778 \times 10^6) \, 360} = 1.0 \times 10^{-9}, \text{ or } 1 \, n \text{ sec.}$$

The problem with this direct approach is that phase shifts or group delay effects of the modulator and detector in the test path are included in the measurement. Such effects can be predetermined and subtracted from the measured group delay, but changes in these effects as a result of temperature changes, or as the result of carrier frequency changes, may introduce error since such effects are not present in the reference signal path.

OBJECTS AND SUMMARY OF THE INVENTION

An object of this invention is to provide a method of measuring group delay without the need for determining the group delay effects of components in the test path due to changes in temperature, aging of components, and the like, or carrier frequency.

Another object is to provide apparatus which facilitates group delay mesurements of systems.

These and other objects of the invention are achieved by sweeping a voltage controlled oscillator to generate a carrier frequency over the range desired for the system under test, amplitude modulating the carrier with a signal of lower frequency, dividing the modulated carrier to a test path which includes a system under test and a detector, and a reference path which includes a detector, comparing the signal phase of the test path with the reference path at the outputs of the detectors, and recording the change in phase difference (group delay) as a function of carrier frequency. The voltage controlled oscillator is first set for a continuous output at the center of the desired test band, and using an oscilloscope connected to a detector without a test system in its path, the modulator is adjusted for maximum detected signal with minimum distortion. Then with the reference path and the test path (without a test system) connected to the phase comparator, the reference and test path lengths (group delays) are balanced for zero degrees at the output of the phase comparator. Next the system to be tested is connected in series with the detector in the test path, ahead of the detector. With the voltage controlled oscillator still at a continuous frequency at the center of the desired test path, the sensitivity of a group delay recorder is adjusted for sufficient range to record total group delay of the device under test. If group delay resolution is insufficient on the recorder, due to the test system having too large a group delay, a sufficiently long (equivalent) cable may be inserted in the reference path to permit adjusting the recorder sensitivity to the desired range of group delay. Then prior to recording group delay as a function of carrier frequency, both the system under test and the equivalent cable are removed while the output of the phase comparator is again balanced. Now the group delay versus frequency of the test system is recorded at different temperatures or environmental stress levels of the system, such as in different magnetic fields.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
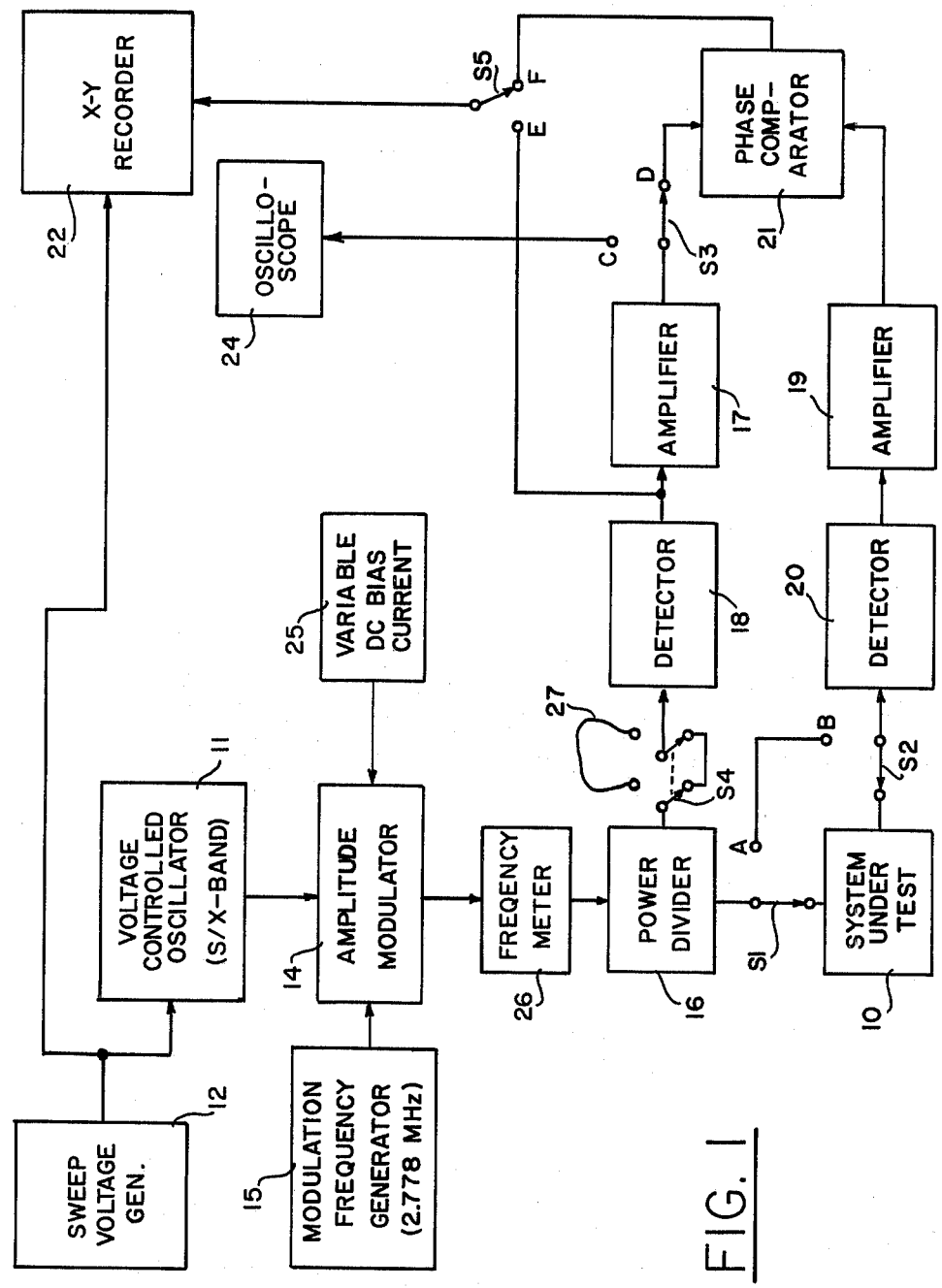
FIG. 1 is a schematic diagram of the invention.

Referring to FIG. 1 of the drawings, it shows a test set for recording group delay directly as a function of carrier frequency while testing a system 10 for changes in group delay over an S- or X-band of interest due to temperature and/or mechanical stress. A voltage-controlled oscillator 11 is employed to sweep through the band of interest in response to the output of a sweep voltage generator 12 via an operational amplifier 13.

The output of the swept oscillator 11 is amplitude modulated in a modulator (balanced mixer) 14 by a signal of lower frequency from a stable source 15. The modulated carrier is then divided between two paths (a test path that includes the system under test and a reference path) by a power divider which may consist of a directional coupler, hybrid-T junction, or the like. The reference path includes an amplifier 17 and detector 18 which match an amplifier 19 and detector 20 in order that, with the system under test bypassed by switches $S_1$ and $S_2$ at points A and B, the group delay through the two paths will be equal. To maintain this equality, the amplifiers and detectors are maintained at the same temperature by placing them adjacent each other in the test unit and preferably in a temperature-controlled cabinet so that the balanced output of the detectors can be maintained after balancing the test unit in a manner to be described hereinafter.

The amplitude demodulated outputs of the detectors are compared in a phase comparator 21 implemented with, for example, a vector volt meter, to obtain a DC output signal proportional to the phase difference between the two test-set paths. By comparing the phase of the modulated and detected signals from the two paths, the group delay is simply:

$$td = \frac{\phi}{(fm)} 360$$

where: fm = modulating frequency, Hz. In theory, the modulating frequency, fm, may be selected for a group delay measurement of any units of time, but for the S- and X-band it is most convenient to select the frequency modulation to be 2.7778 MHz so that the output of the phase comparator will be in units of one nanosecond ($1.0 \times 10^{-9}$ sec.) per degree of phase difference, as noted hereinbefore.

Amplitude modulation and detection of the test carrier signal will not affect the group delay of the system under test since the reference and test paths both include the modulation and detection. The amplitude modulator is common to both paths so that any changes in group delay in the modulator will not affect the group delay test, and since the detector and amplifier in one path is balanced with the detector and amplifier in the other path, any group delay changes that might occur during a test, such as might be experienced due to changes in the environmental temperature of the detectors and amplifiers, will not affect the group delay test.

An X-Y recorder 22 receives the DC output of the phase comparator at its vertical control input while it receives at its horizontal control the output of the sweep voltage generator. The result is a direct recording of group delay, td, as a function of carrier frequency, f.

The process for measuring group delay of microwave components will now be described in detail. The component may be an amplifier, cable, waveguide and even a system, both in a laboratory and in the field, including installed components and systems. Group delay may be measured without the laborious task of reducing phase/frequency data to group delay data.

The first step is to set the sweep and modulation of the carrier with the switches S1 and S2 at points A and B, and the switch S3 at point C. That connects the vertical input of an oscilloscope 24 to the reference path amplifier 17 in order to observe the amplitude and distortion of the modulated carrier out of the reference path. The amplitude of the S/X-band voltage controlled oscillator is adjusted to a maximum (approximately +10 dBm) for a continuous wave (CW) output at the center of the desired testband. A variable source 25 of DC bias current (0–20 ma), and the modulation signal from the generator 15, are adjusted for maximum signal with minimum distortion by observing the signal display on the oscilloscope. This step of verifying the modulation frequency is necessary because it is possible to create a second harmonic of the modulation signal in a balanced-mixer (modulator) by supplying insufficient DC bias to it, or by overdriving it with bias and/or modulation signal level. The second harmonic would then cause the group delay measurement to be off by a factor of two.

The modulation source 15 should have frequency stability of ± 0.001% which will produce an accuracy of ±.001 $\times 10^{-9}$ sec. measurement accuracy. The oscillator 11 is designed for high stability of about ±0.0004% of the selected center frequency with an accuracy of the frequency of about −1%, such as in a Series 8600 Hewlett Packard Sweep Oscillator. The amplitude of the sweep voltage from the generator 12 is adjusted to achieve the desired RF frequency range.

The second step is to remove the oscilloscope and reconnect the phase comparator reference input to the amplifier 17 through the switch S3 at point D, and balance the reference and test path group delays (lengths) for zero degrees at the comparator output. This may be done, for example, by adjusting phase offset in the phase comparator implemented as in a Hewlett Packard Vector Voltmeter Model 8405A with a 360° phase range and 0.1° resolution over a range from 1 MHz to 1 GHz in 21 overlapping octave bands with offset of ±180° in 10° steps.

Figure 2:
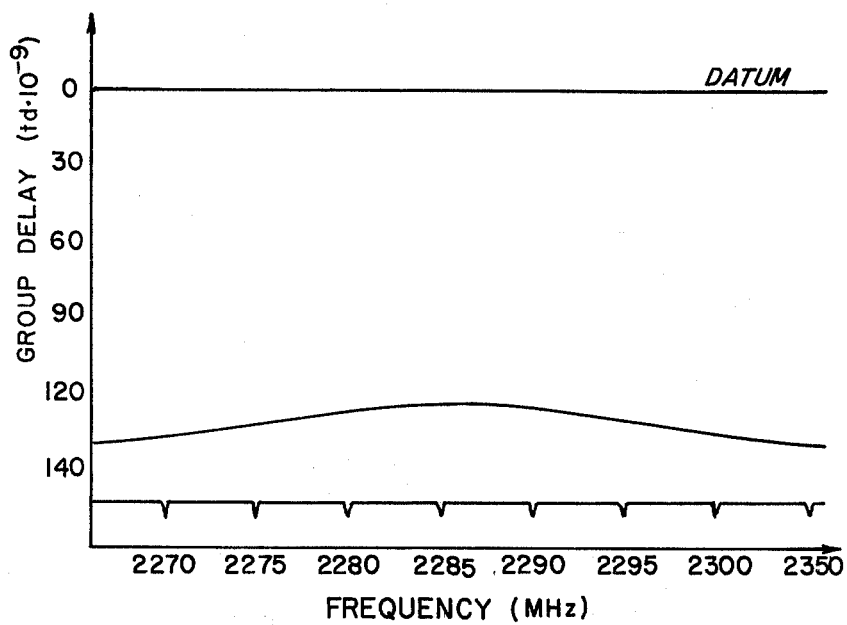
FIGS. 2 and 3 are examples of test records made with the present invention.

The third step is to connect the system to be tested through switches S1 and S2, and note the group delay. Then adjust the X-Y recorder sensitivity for sufficient range to record total group delay of the system under test. Repeat the adjustments in the second step, then record group delay (td) versus frequency (f) across the desired frequency range with and without the test device connected. Then connect the X-Y recorder vertical input to the reference channel detector output by turning the switch S5 to point F, and record frequency absorption at intervals (e.g., every 5MHz as shown in FIG. 2) specified for the frequency band of the device being tested using an absorption-type frequency meter. If group delay resolution is less than 1 nsec per inch on the X-Y recorder, due to the test device group delay exceeding $6 \times 10^{-9}$ seconds, as shown in FIG. 2 (where the applied stress is an electromagnetic field for a microwave amplifier), proceed with the next step to improve the td recording resolution prior to conducting stress testing of the device under test. Otherwise skip to the testing step.

The fourth step is to insert a length of cable 27 approximately equivalent to the electrical length of the system under test in the reference path and adjust the X-Y recorder 22 for 1 nanosecond per inch sensitivity. Prior to making a test recording of group delay (td) versus frequency, it is necessary to remove the system under test and the equivalent length cable in the reference line, and to rebalance the reference and test path phase difference as described in the second step above.

Figure 3:
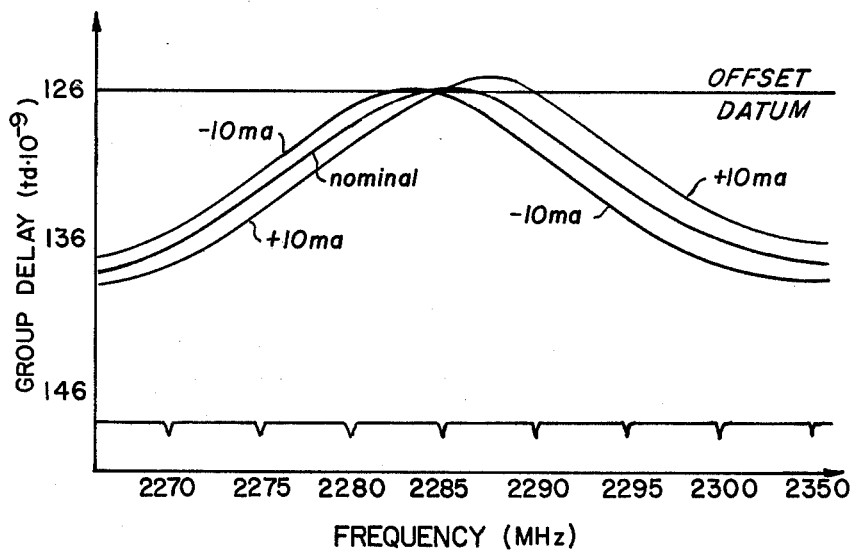

Once steps 1 through 3 have been completed, and, if necessary, the fourth step has been completed, followed by a repeat of the second step, the fifth step of testing the system for group delay is undertaken for measuring group delay due to temperature and/or environmental stress. This is done by recording the group delay, td, versus frequency, f, with frequency markers. It is necessary to repeat balancing of the reference and test signal as described above in order to record the td versus frequency at the different temperature and/or environmental stress points of interest. The resulting family of td recordings will display the group delay distortion caused by temperature and/or environmental stress such as a family of curves as shown in FIG. 3 for the same microwave amplifier as in FIG. 2 tested under three conditions of applied magnetic field in order to predict the operation of the amplifier at different orientations in the earth's magnetic fields. Note that the group delay resolution has been improved through the use of step 4 above.

Although particular embodiments of the invention have been described and illustrated herein, it is recognized that modifications and variations may readily occur to those skilled in the art. For example, an amplifier may be inserted between the system under test and the switch S2 for measuring high insertion loss systems. In that event, the group delay of the inserted amplifier must be separately determined and subtracted. Another example is provision for variable gain in the phase comparator 21 for those cases where the comparator output is expected to be very low, although the recorder 22 can, in the usual case, be adjusted for vertical as well as horizontal control sensitivity. Consequently, it is intended that the claims be interpreted to cover such modifications and variations.

What is claimed is:

1. A method of measuring group delay of a system under test using a sweep voltage generator, a voltage controlled oscillator responsive to the sweep voltage generator to sweep the oscillator frequency over a test bandwidth of interest by controlling the frequency output of said oscillator with the output of said sweep voltage generator, and a modulation frequency generator for amplitude modulating the output of said oscillator with the output of said modulation frequency generator, comprising the steps of applying the modulated sweep signal to both a reference path and a test path containing said system under test, separately demodulating said modulated sweep signal transmitted through said reference and test paths to provide demodulated signals, and comparing the phase of the demodulated signal from the reference path with the demodulated signal from the test path to determine the phase difference as a measure of group delay.

2. The method of claim 1 including the recording of the measured group delay as a function of frequency control of said oscillator.

3. The method of claim 2 wherein said measured group delay is recorded directly while sweeping said controlled oscillator through said bandwidth of interest.

4. The method of claim 3 wherein a parameter which may affect group delay of the system under test is varied for different frequency sweeps to develop a family of data curves.

5. A method as defined in claim 4 wherein said modulation frequency is selected to be 2.778 MHz for direct reading of group delay in nanoseconds as a function of frequency.

6. Apparatus for measuring group delay of a system under test using a sweep voltage generator, a voltage controlled means responsive to the sweep voltage generator to sweep a carrier frequency output of said voltage controlled means with the output of said sweep voltage generator, means for amplitude modulating the carrier output of said voltage controlled means with a signal of fixed frequency, means for applying the modulated carrier simultaneously to both a reference path and a test path containing said system under test, means for separately demodulating said modulated sweep signal transmitted through said reference and test paths to provide demodulated signals, and means for comparing the phase of the demodulated signal from the reference path with the demodulated signal from the test path to determine the phase difference as a measure of group delay.

7. Apparatus of claim 6 including means for recording the measured group delay as a function of frequency control of said carrier frequency.

8. Apparatus of claim 7 wherein said recording means records directly while said voltage controlled means is swept through said bandwidth of interest.

9. Apparatus as defined in claim 4 wherein said fixed modulation frequency is selected to be 2.778 MHz for direct reading of group delay in nanoseconds as a function of carrier frequency.

10. Apparatus as defined in claim 9 wherein said carrier is swept over a bandwidth of interest in the range of S or X-band and said means for applying the modulated carrier to both a reference path and a test path is comprised of a microwave power divider.

11. Apparatus for recording directly group delay measurement of a system under temperature and/or stress tests comprising means for generating an amplitude modulated carrier frequency swept over a bandwidth of interest, means for dividing said modulated carrier through a reference path and a test path, each path including separate means for demodulating said carrier; means for comparing the phase of the demodulated outputs of said demodulating means while said modulated carrier is swept in frequency over the band of interest for different test conditions, and means for recording each test, whereby a family of characteristic group-delay curves may be obtained for the system under test.

* * * * *